United States Patent
Nyhus et al.

(10) Patent No.: US 10,459,338 B2
(45) Date of Patent: Oct. 29, 2019

(54) EXPOSURE ACTIVATED CHEMICALLY AMPLIFIED DIRECTED SELF-ASSEMBLY (DSA) FOR BACK END OF LINE (BEOL) PATTERN CUTTING AND PLUGGING

(71) Applicant: Intel Corporation, Santa Clara, CA (US)

(72) Inventors: Paul A. Nyhus, Portland, OR (US); Eungnak Han, Beaverton, OR (US); Swaminathan Sivakumar, Beaverton, OR (US); Ernisse S. Putna, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/480,208

(22) Filed: Apr. 5, 2017

(65) Prior Publication Data

US 2017/0207116 A1    Jul. 20, 2017

Related U.S. Application Data

(62) Division of application No. 14/039,140, filed on Sep. 27, 2013, now Pat. No. 9,625,815.

(51) Int. Cl.
| | |
|---|---|
| *G03F 7/039* | (2006.01) |
| *H01L 21/033* | (2006.01) |
| *H01L 21/3105* | (2006.01) |
| *H01L 21/32* | (2006.01) |
| *H01L 21/768* | (2006.01) |
| *G03F 7/00* | (2006.01) |
| *G03F 7/004* | (2006.01) |
| *G03F 7/038* | (2006.01) |
| *G03F 7/11* | (2006.01) |
| *G03F 7/16* | (2006.01) |
| *G03F 7/20* | (2006.01) |
| *G03F 7/26* | (2006.01) |
| *H01L 21/3205* | (2006.01) |
| *H01L 21/3213* | (2006.01) |
| *B81C 1/00* | (2006.01) |

(52) U.S. Cl.
CPC ........ *G03F 7/0392* (2013.01); *B81C 1/00428* (2013.01); *G03F 7/0002* (2013.01); *G03F 7/0045* (2013.01); *G03F 7/038* (2013.01); *G03F 7/039* (2013.01); *G03F 7/11* (2013.01); *G03F 7/16* (2013.01); *G03F 7/2004* (2013.01); *G03F 7/2037* (2013.01); *G03F 7/26* (2013.01); *H01L 21/0337* (2013.01); *H01L 21/31058* (2013.01); *H01L 21/32* (2013.01); *H01L 21/3205* (2013.01); *H01L 21/32139* (2013.01); *H01L 21/76816* (2013.01); *B81C 2201/0149* (2013.01)

(58) Field of Classification Search
CPC ........... H01L 21/0337; H01L 21/31058; H01L 21/32

USPC .......................................................... 430/296
See application file for complete search history.

(56) References Cited

U.S. PATENT DOCUMENTS

| | | | |
|---|---|---|---|
| 3,987,214 A * | 10/1976 | Napoli | C23C 14/545 |
| | | | 118/712 |
| 3,987,215 A | 10/1976 | Cortellino | |
| 3,996,393 A * | 12/1976 | Cortellino | G03F 7/039 |
| | | | 427/273 |
| 7,384,711 B2 | 6/2008 | Kim et al. | |
| 2002/0055239 A1 | 5/2002 | Tuominen et al. | |
| 2008/0070010 A1 | 3/2008 | Dravid et al. | |
| 2008/0093743 A1 | 4/2008 | Yang et al. | |
| 2008/0233435 A1 | 9/2008 | Hasegawa et al. | |
| 2009/0001045 A1 | 1/2009 | Chen et al. | |
| 2009/0200646 A1 | 8/2009 | Millward et al. | |
| 2009/0236309 A1 | 9/2009 | Millward et al. | |
| 2010/0092873 A1 | 4/2010 | Sills et al. | |
| 2012/0116007 A1 | 5/2012 | Gopalan et al. | |
| 2012/0127454 A1 | 5/2012 | Nakamura et al. | |
| 2012/0211171 A1* | 8/2012 | Patel | B29C 63/0004 |
| | | | 156/538 |
| 2012/0228262 A1 | 9/2012 | Tanaka et al. | |
| 2012/0244474 A1 | 9/2012 | Asakawa et al. | |
| 2013/0200498 A1 | 8/2013 | Mangan | |
| 2013/0209696 A1 | 8/2013 | Sharma et al. | |
| 2013/0230981 A1 | 9/2013 | Kawamura | |
| 2014/0162905 A1 | 6/2014 | Lenhert et al. | |
| 2015/0170961 A1 | 6/2015 | Romero et al. | |
| 2016/0190009 A1 | 6/2016 | Wallace et al. | |

FOREIGN PATENT DOCUMENTS

| | | |
|---|---|---|
| EP | 2 121 514 | 11/2009 |
| TW | 201232188 | 8/2012 |

OTHER PUBLICATIONS

International Search Report and Written Opinion from PCT/US2014/56126 dated Dec. 30, 2014, 13 pages.
Office Action and Search Report for Taiwan Patent Application No. 103129557, dated Jun. 30, 2015, 6 pages.
International Preliminary Report on Patentability from PCT/US2014/056126 dated Apr. 7, 2016, 10 pages.
Office Action for Taiwanese Patent Application No. 103129557, dated Dec. 9, 2015, 3 pgs.
Non-Final Office Action for U.S. Appl. No. 14/039,140 dated Aug. 25, 2016, 15 pgs.
Vietnamese Office Action for Application No. 1-2016-00573, dated Aug. 26, 2016, 3 pgs.

(Continued)

*Primary Examiner* — Cynthia Hamilton
(74) *Attorney, Agent, or Firm* — Schwabe, Williamson & Wyatt, P.C.

(57) ABSTRACT

Self-aligned via and plug patterning for back end of line (BEOL) interconnects are described. In an example, a structure for directed self-assembly includes a substrate and a block co-polymer structure disposed above the substrate. The block co-polymer structure has a polystyrene (PS) component and a polymethyl methacrylate (PMMA) component. One of the PS component or the PMMA component is photosensitive.

3 Claims, 10 Drawing Sheets

(56) References Cited

OTHER PUBLICATIONS

Non-Final Office Action from U.S. Appl. No. 14/039,140 dated Aug. 13, 2015, 16 pgs.
Final Office Action from U.S. Appl. No. 14/039,140 dated Feb. 12, 2016, 9 pgs.
Crook, et al. "Erasable electrostatic lithography for quantum components" Nature, vol. 424, Aug. 14, 2003, 4 pgs.
Extended European Search Report from European Patent Application No. 14847868.8-1555 dated Mar. 24, 2017, 12 pgs.
Office Action for Chinese Patent Application No. 201480046368.X, dated Feb. 26, 2018.
Notice of Allowance for Taiwan Patent Application No. 103129557, dated Jan. 10, 2017, 2 pages.
Office Action from Chinese Patent Application No. 201480046368.X, dated Nov. 11, 2019, 7 pages.

* cited by examiner

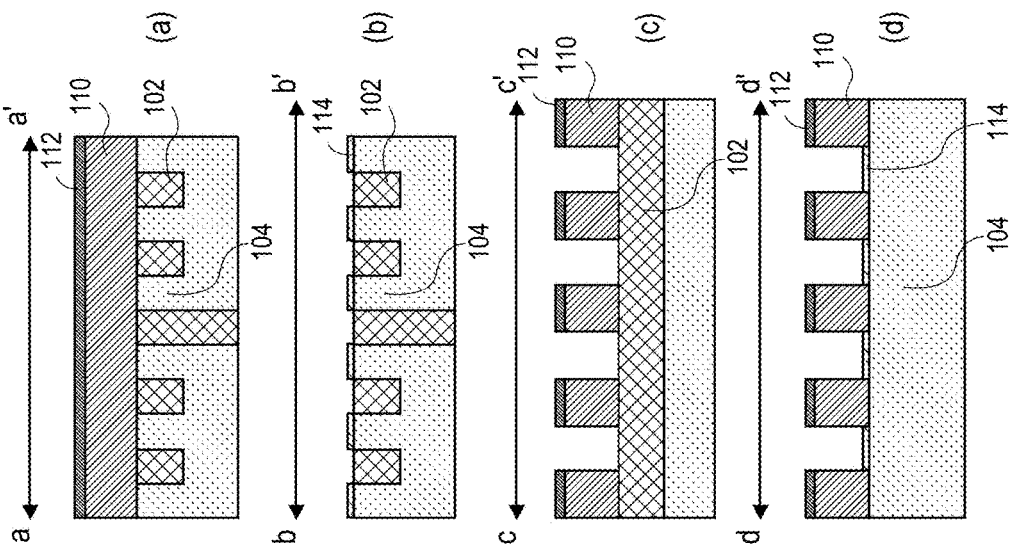
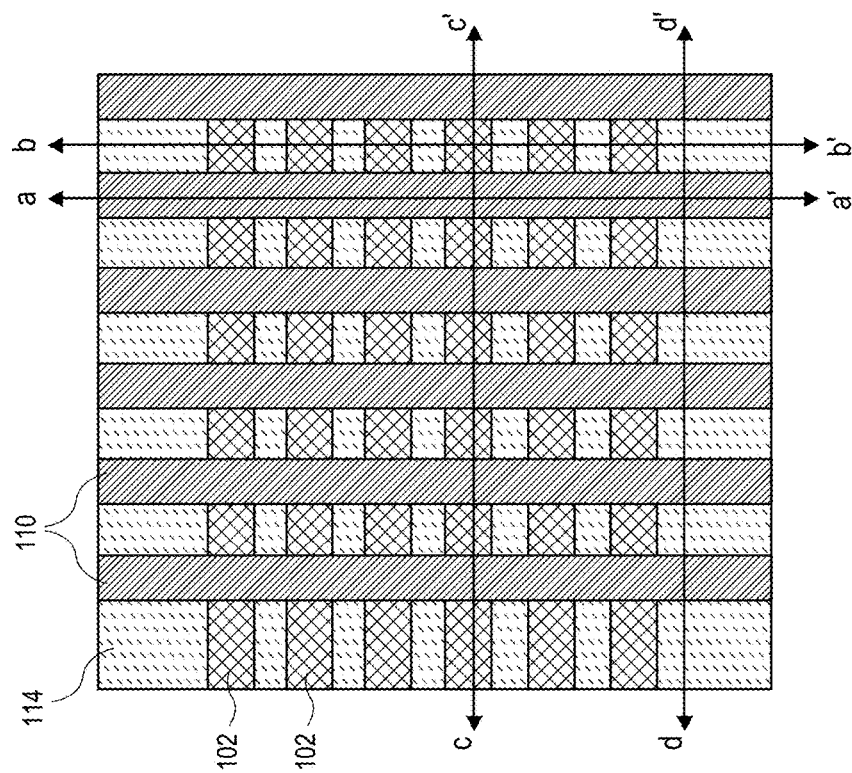
FIG. 3

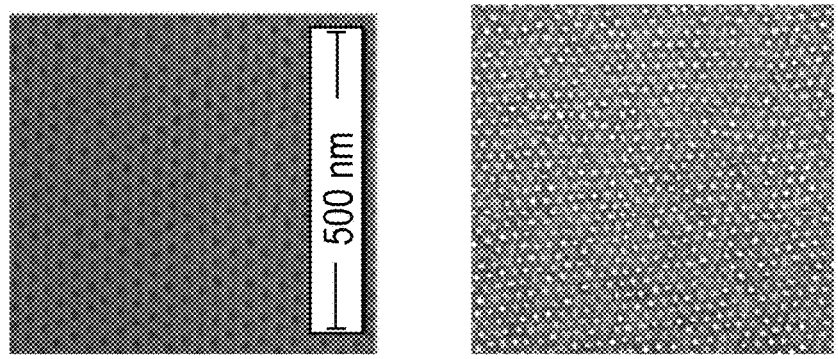
Acid cleavable PS-b-PEO
Acetal-Based Junction
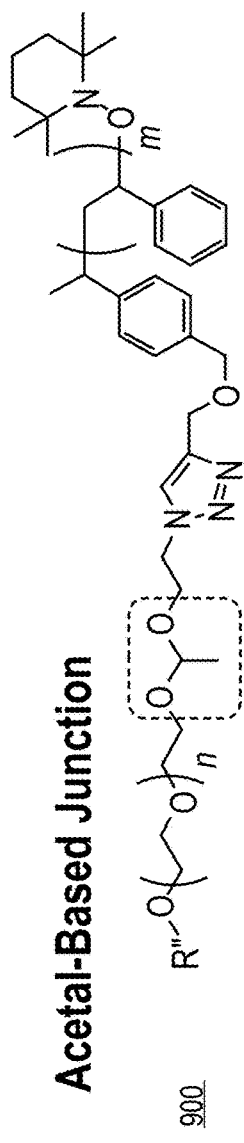
Acid-Degradable PEO-b-PS copolymers
900
Tritylether Junction
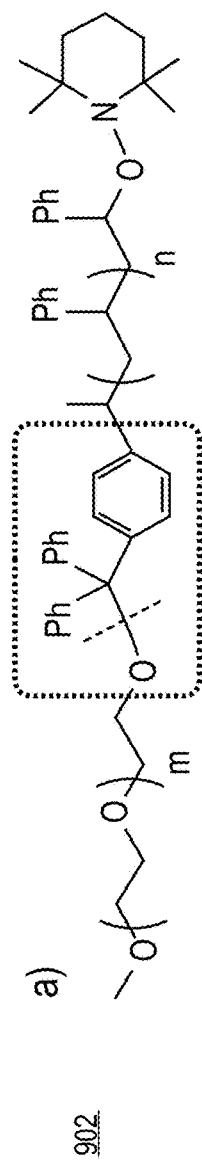
902
FIG. 9

EXPOSURE ACTIVATED CHEMICALLY AMPLIFIED DIRECTED SELF-ASSEMBLY (DSA) FOR BACK END OF LINE (BEOL) PATTERN CUTTING AND PLUGGING

CROSS-REFERENCE TO RELATED APPLICATIONS

This application is a divisional of U.S. patent application Ser. No. 14/039,140, filed on Sep. 27, 2013, the entire contents of which are hereby incorporated by reference herein.

TECHNICAL FIELD

Embodiments of the invention are in the field of semiconductor structures and processing and, in particular, self-aligned via and plug patterning for back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIG. 3 illustrates a plan view and corresponding cross-sectional views of the structure of FIG. 2 following optional selective differentiation all of the potential via locations from all of the plug locations, in accordance with an embodiment of the present invention.

exposure to provide a cleaved pairing, in accordance with an embodiment of the present invention.

FIG. 9 illustrates a schematic and corresponding clock co-polymer image for each of an acetal based junction and a trityl ether junction, in accordance with an embodiment of the present invention.

Figure 10:
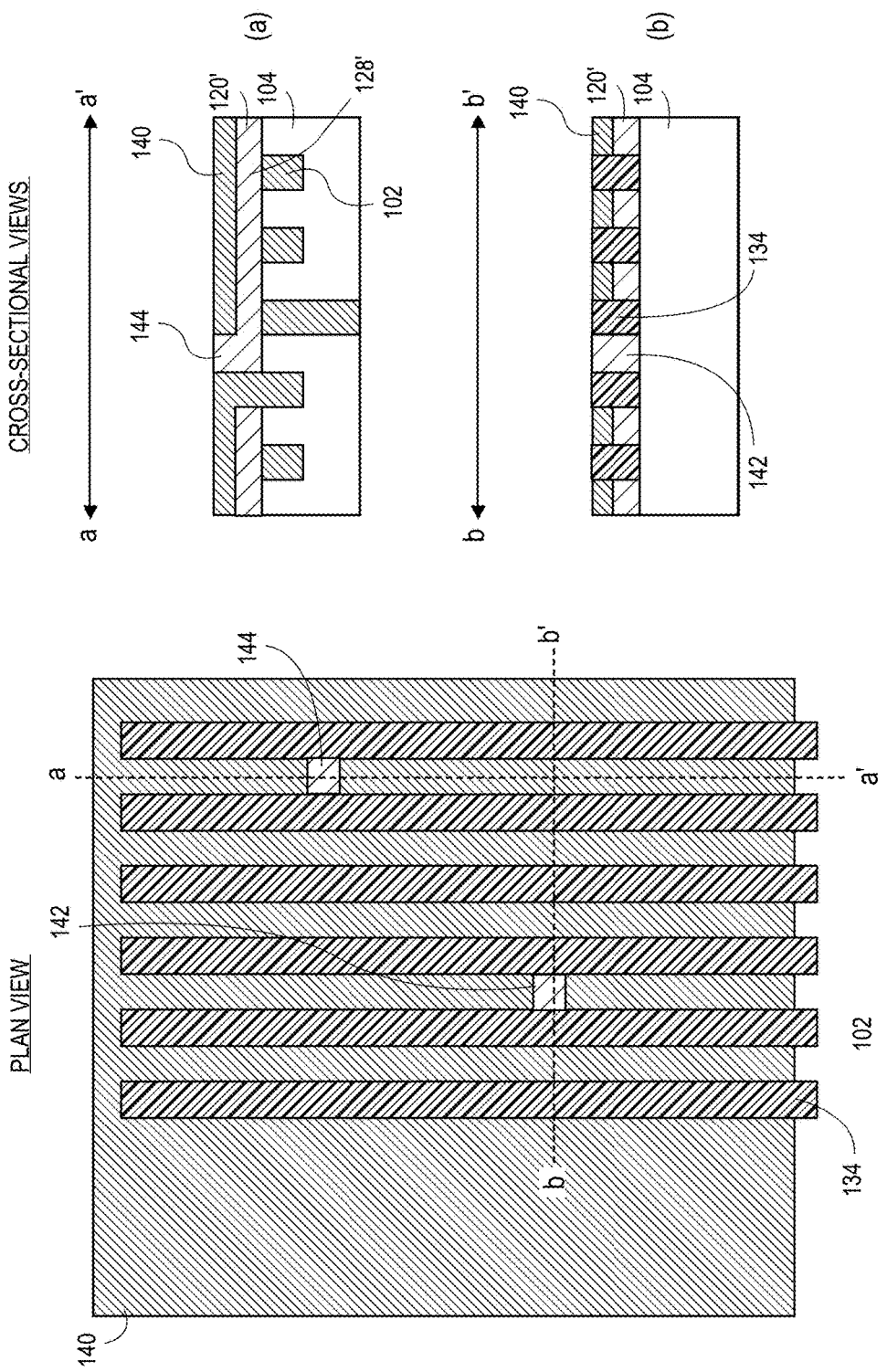

FIG. 10 illustrates a plan view and corresponding cross-sectional views of a DSA-based structure following metal line, via and plug formation, in accordance with an embodiment of the present invention.

Figure 11:
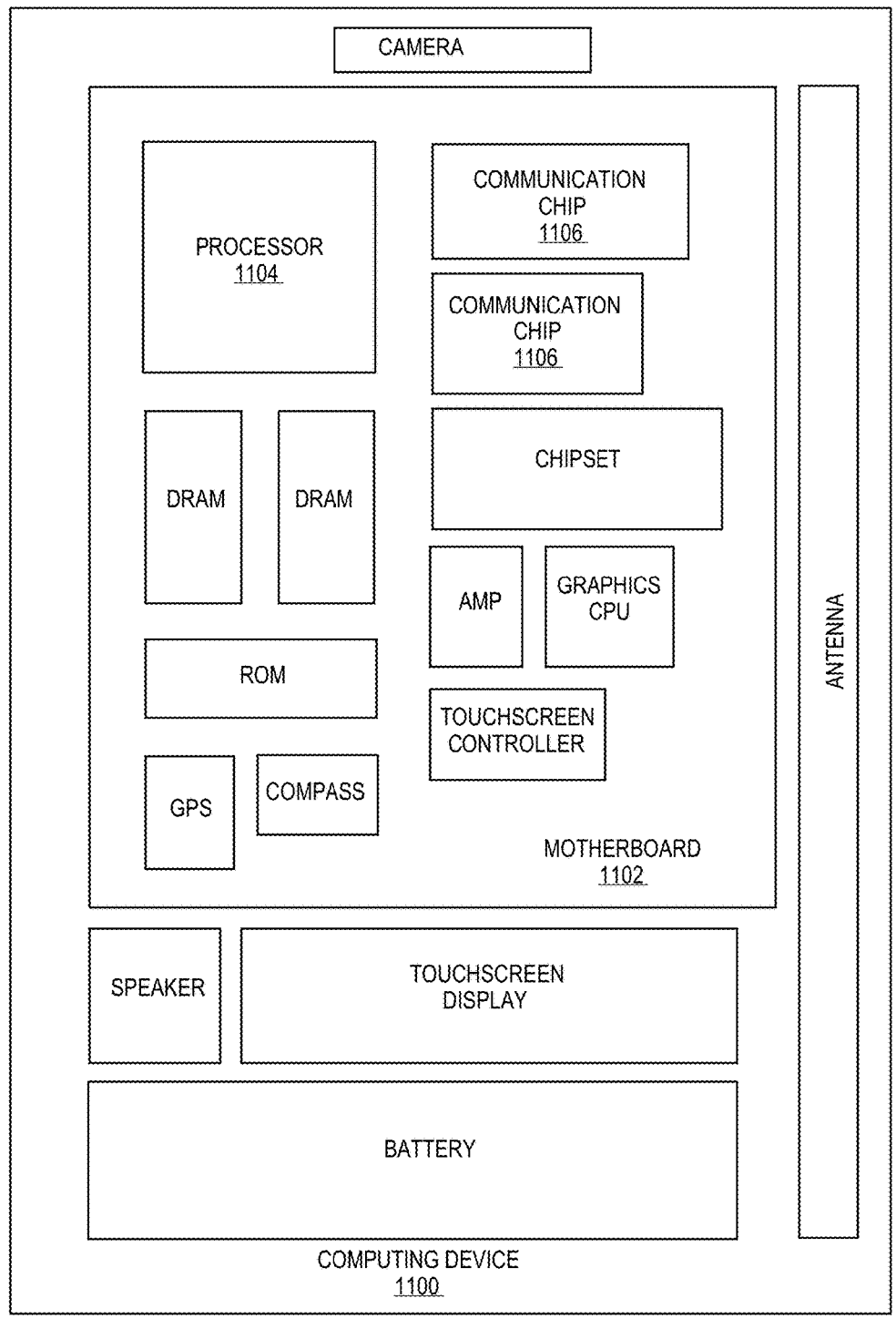

FIG. 11 illustrates a computing device in accordance with one implementation of the invention.

DESCRIPTION OF THE EMBODIMENTS

Self-aligned via and plug patterning for back end of line (BEOL) interconnects is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments are directed to exposure activated chemically amplified directed self-assembly (DSA) for BEOL pattern cutting and plugging. One or more embodiments at least partially addresses two significant issues facing the semiconductor manufacturing industry. The first issue relates to line width roughness (LWR) and critical dimension uniformity (CDU) vis-a-vis dose tradeoffs for very short wavelength patterning techniques such as e-beam lithography or extreme ultra-violet (EUV) lithography. The second issue pertains to selecting subsets of DSA structures for opening. Overall, one or more embodiments described herein provide solutions to the above issues by providing photosensitive DSA approaches.

Further regarding the selection of DSA structures for opening, it is to be understood that the use of DSA materials can provide a relatively inexpensive avenue to generating small feature sizes and very tight pitches well beyond the capability of traditional lithography techniques (e.g., well beyond 193 nm lithography and EUV lithography). However, significant challenges to implementing DSA in production remain. For example, in some proposed via schemes based on DSA, many more potential via locations are generated relative to the final total amount of vias than are actually needed. In a specific case, greater detail of the context of which is described below, all the required polymethyl methacrylate (PMMA) cylinders are generated where vias are to be formed, but there are many more cylinders generated where they will not be formed. Without a process operation that distinguish between such via locations, all the vias would otherwise be etched into the substrate resulting in a non-functioning circuit. There are traditional means of selecting the vias to be opened such as patterning an ArF resist, EUV resist, or e-beam resist above the DSA. However, this approach requires coating another layer of hardmask, resist and/or other layers, and subsequent etch operations to etch and clean such materials from the wafer. The extra operations add to the expense of the process, the time taken for the processing, as well as provide many more opportunities for defects to be introduced, impacting yield. In accordance with one or more embodiments described herein, the sheer number of processing operations is reduced by modifying the chemistry of the DSA in such a way that the PMMA (or polystyrene (PS)) cylinders can be made photo or e-beam sensitive and can individually addressed by any one of these lithography techniques without use of an extra resist or substrate.

Further regarding controlling LWR, CDU, and dose for EUV patterning and e-beam patterning, it is to be understood that EUV lithography faces several critical shortcomings with existing technology, e.g., a throughput challenge and an LWR/CDU challenge. EUV sources are not powerful enough to allow tools to process wafers at a rate that makes EUV cost effective. In addition, the line width roughness and hole CD uniformity as a fraction of the target CD of the features are much higher for EUV than they are for the more mature 193 nm lithography. While resists can be tuned to be more sensitive and thus require less dose to open up features, there can be detrimental impact to LWR and CDU. It appears that both CDU and dose targets cannot be attained at the same time and it is not clear whether it is even possible to strike a balance with the current technology. Thus, in accordance with one or more embodiments described herein, exposure sensitive DSA is used effectively as a resist to allow printing of holes and trenches with significantly lower LWR and CDU inherent with DSA and with much lower dose requirements by decoupling the LWR/CDU and dose correlation with standard EUV resists.

More generally, one or more embodiments described herein are directed to previous layer self-aligned via and plug patterning. The self-aligned aspect of the processes described herein may be based on a directed self-assembly (DSA) mechanism, as described in greater detail below. In an embodiment, processes described herein enable realization of self-aligned metallization for back-end of line feature fabrication. To provide context, patterning and aligning of features at less than approximately 50 nanometer pitch requires many reticles and critical alignment strategies that are extremely expensive for a semiconductor manufacturing process.

Embodiments described herein involve the fabrication of metal and via patterns based on the positions of an underlying layer. That is, a metal interconnect process is effectively reversed and built from the previous layer up. This is in contrast to a conventional approach where an interlayer dielectric (ILD) is first deposited, with a pattern for metal and via layers subsequently patterned therein. In the conventional approach, alignment to a previous layer is performed using a lithography scanner alignment system. The ILD is then etched.

More specifically, one or more embodiments are directed to an approach that employs an underlying metal as a template to build the conductive vias and non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment no longer affects via or plug placements. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

The following Figures illustrate portions of integrated circuit layers representing various operations in a method of self-aligned via and metal patterning, in accordance with an embodiment of the present invention.

Figure 1:
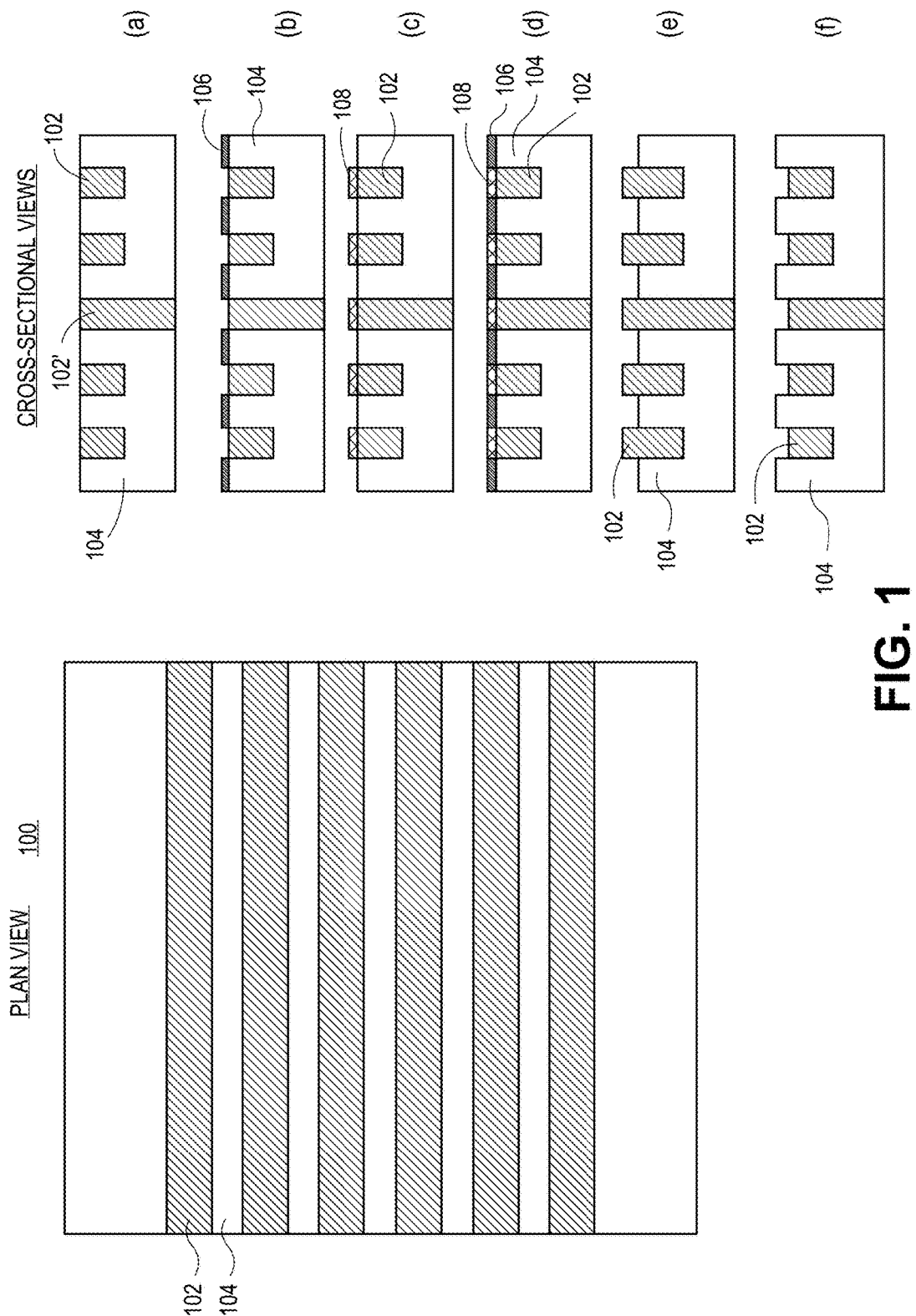
FIG. 1 illustrates a plan view and corresponding cross-sectional views of options for a previous layer metallization structure, in accordance with an embodiment of the present invention.

FIG. 1 illustrates a plan view and corresponding cross-sectional views of options for a previous layer metallization structure, in accordance with an embodiment of the present invention. Referring to the plan view and corresponding cross-section view option (a), a starting structure 100 includes a pattern of metal lines 102 and interlayer dielectric (ILD) lines 104. The starting structure 100 may be patterned in a grating-like pattern with metal lines spaced at a constant pitch and having a constant width, as is depicted in FIG. 1 if self-assembling materials are being used. Some of the lines may be associated with underlying vias, such as line 102' shown as an example in the cross-sectional views.

Referring again to FIG. 1, alternative options (b)-(f) address situations where an additional film is formed (e.g., deposited, grown, or left as an artifact remaining from a previous patterning process) on a surface of one of, or both of, the metal lines 102 and interlayer dielectric lines 104. In example (b), an additional film 106 is disposed on the interlayer dielectric lines 104. In example, (c), an additional film 108 is disposed on the metal lines 102. In example, (d) an additional film 106 is disposed on the interlayer dielectric lines 104, and an additional film 108 is disposed on the metal lines 102. Furthermore, although the metal lines 102 and the interlayer dielectric lines 104 are depicted as co-planar in (a), in other embodiments, they are not co-planar. For example, in (e), the metal lines 102 protrude above the interlayer dielectric lines 104. In example, (f), the metal lines 102 are recessed below the interlayer dielectric lines 104.

Referring again to examples (b)-(d), an additional layer (e.g., layer 106 or 108) can be used as a hardmask (HM) or protection layer or be used to enable self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a directed self-assembly process.

In an embodiment, as used throughout the present description, interlayer dielectric (ILD) material, such as the material of the interlayer dielectric lines 104, is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material, such as the material of metal lines 102, is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used for self-aligned via and plug formation.

In an embodiment, as is also used throughout the present description, hardmask materials, such, as layers 106 or 108 if included as a hardmask, are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be understood that the layers and materials described in association with FIG. 1 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1 may be fabricated on underlying lower level interconnect layers.

Figure 2:
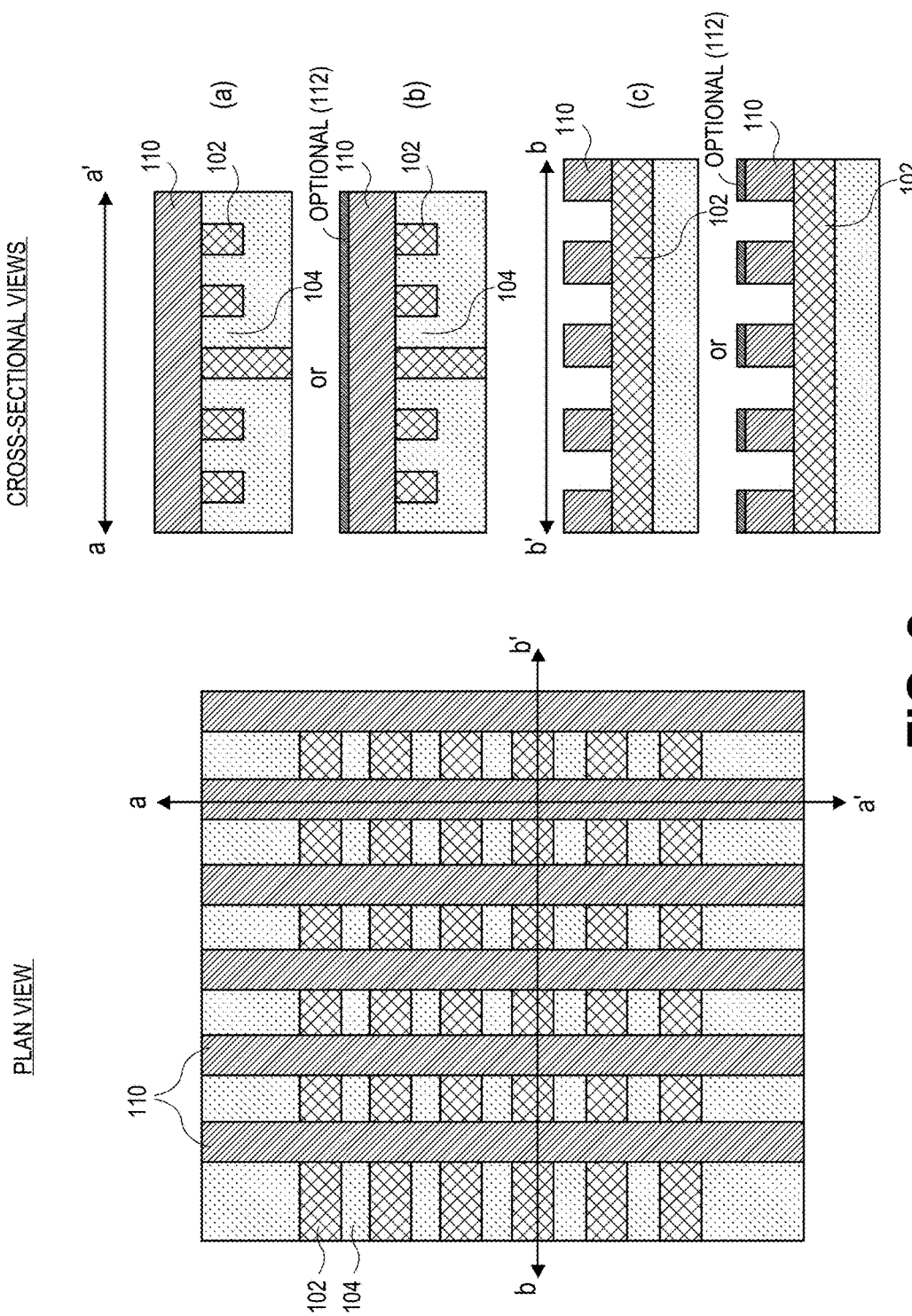
FIG. 2 illustrates a plan view and corresponding cross-sectional views of the structure of FIG. 1 following formation of interlayer dielectric (ILD) lines above the structure of FIG. 1, in accordance with an embodiment of the present invention.

FIG. 2 illustrates a plan view and corresponding cross-sectional views of the structure of FIG. 1 following formation of interlayer dielectric (ILD) lines 110 above the structure of FIG. 1, in accordance with an embodiment of the present invention. Referring to the plan view and corresponding cross-sectional views (a) and (c) taken along axes a-a' and c-c', respectively, the ILD lines 110 are formed in a grating structure perpendicular to the direction of underlying lines 104. In an embodiment, a blanket film of the material of lines 110 is deposited by chemical vapor deposition or like techniques. In an embodiment, the blanket film is then patterned using lithography and etch processing which may involve, e.g., spacer-based-quadruple-patterning (SBQP) or pitch quartering. It is to be understood that the grating pattern of lines 110 can be fabricated by numerous methods, including EUV and/or EBDW lithography, directed self-assembly, etc. As will be described in greater detail below, subsequent metal layer will thus be patterned in the orthogonal direction relative to the previous metal layer since the grating of lines 110 is orthogonal to the direction of the underlying structure. In one embodiment, a single 193 nm lithography mask is used with alignment/registration to the previous metal layer 102 (e.g., grating of lines 110 aligns to the previous layer 'plug' pattern in X and to the previous metal grating in Y). Referring to cross-sectional structures (b) and (d), a hardmask 112 may be formed on, or retained following pattering of, dielectric lines 110. The hardmask 112 can be used to protect lines 110 during subsequent patterning steps. As described in greater detail below, the formation of lines 110 in a grating pattern provides a permanent or sacrificial layer and can be used as a subsequent DSA guide layer.

FIG. 3 illustrates a plan view and corresponding cross-sectional views of the structure of FIG. 2 following optional selective differentiation all of the potential via locations from all of the plug locations, in accordance with an embodiment of the present invention. Referring to the plan view and corresponding cross-sectional views (a)-(d) taken along axes, a-a', b-b', c-c' and d-d', respectively, following formation of ILD lines 110, a surface modification layer 114 is formed on exposed regions of the underlying ILD lines 104. In an embodiment, surface modification layer 114 is a dielectric layer. In an embodiment, surface modification layer 114 is formed by a selective bottom-up growth approach. In one such embodiment, the bottom-up growth approach involves a directed self-assembly (DSA) brush coat that grows preferentially on the underlying ILD lines 104 or, alternatively, on the metal lines 102 (or on a sacrificial layer deposited or grown on the underlying metal or ILD material).

Figure 4:
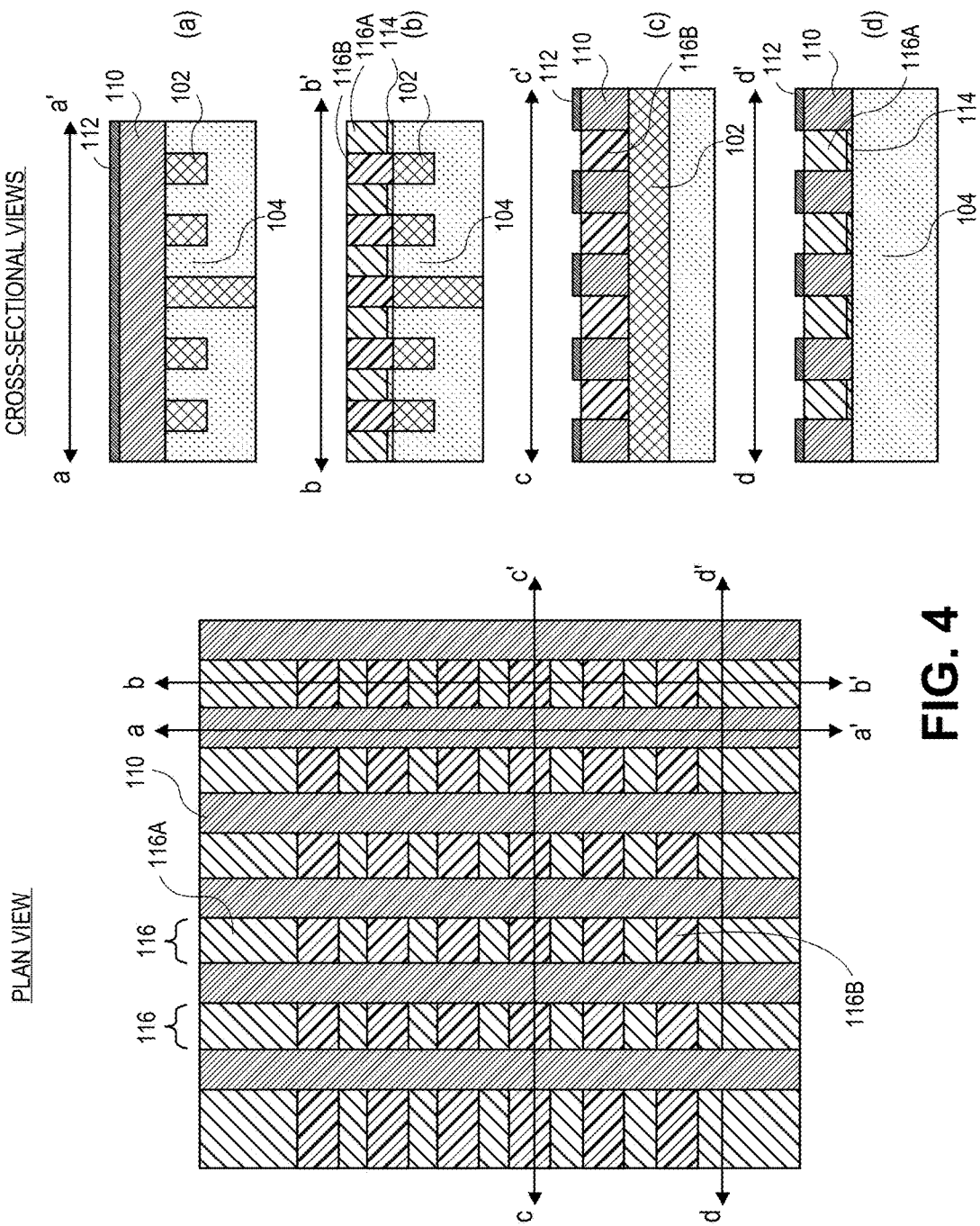
FIG. 4 illustrates a plan view and corresponding cross-sectional views of the structure of FIG. 3 following differential polymer addition to the exposed portions of underlying metal and ILD lines of FIG. 3, in accordance with an embodiment of the present invention.

FIG. 4 illustrates a plan view and corresponding cross-sectional views of the structure of FIG. 3 following differential polymer addition to the exposed portions of underlying metal and ILD lines of FIG. 3, in accordance with an embodiment of the present invention. Referring to the plan view and corresponding cross-sectional views (a)-(d) taken along axes, a-a', b-b', c-c' and d-d', respectively, directed self-assembly (DSA) or selective growth on exposed portions of the underlying metal/ILD 102/104 grating is used to form intervening lines 116 with alternating polymers or alternating polymer components in between the ILD lines 110. For example, as shown, polymer 116A (or polymer component 116A) is formed on or above the exposed portions of interlayer dielectric (ILD) lines 104 of FIG. 3, while polymer 116B (or polymer component 116B) is formed on or above the exposed portions of the metal lines 102 of FIG. 3. Although polymer 116A is formed on or above the surface modification layer 114 described in association with FIG. 3 (see cross-sectional views (b) and (d) of FIG. 4), it is to be understood that, in other embodiments, the surface modification layer 114 can be omitted and the alternating polymers or alternating polymer components can instead be formed directly in the structure described in association with FIG. 2.

Referring again to FIG. 4, in an embodiment, once the surface of the underlying structure (e.g., structure 100 of FIG. 1) has been prepared (e.g., such as the structure of FIG. 2 or the structure of FIG. 3) or is used directly, a 50-50 diblock copolymer, such as polystyrene-polymethyl methacrylate (PS-PMMA), is coated on the substrate and annealed to drive self assembly, leading to the polymer 116A/polymer 116B layer 116 of FIG. 4. In one such embodiment, with appropriate surface energy conditions, the block copolymers segregate based on the underlying material of structure 100. For example, in a specific embodiment, polystyrene aligns selectively to the underlying metal lines 102 (or corresponding metal line cap or hardmask material). Meanwhile, the polymethyl methacrylate aligns selectively to the ILD lines 104 (or corresponding metal line cap or hardmask material).

Thus, in an embodiment, the underlying metal and ILD grid is recreated in the block co-polymer (BCP, i.e., polymer 116A/polymer 116B). This can particularly be so if the BCP pitch is commensurate with the underlying grating pitch. The polymer grid (polymer 116A/polymer 116B) is, in one embodiment, robust against certain small deviations from a perfect grid such. For example, if small plugs effectively place an oxide or like material where a perfect grid would have metal, a perfect polymer 116A/polymer 116B grid can still be achieved. However, since the ILD lines grating is, in one embodiment, an idealized grating structure, with no metal disruptions of the ILD backbone, it may be necessary to render the ILD surface neutral since both types of polymer (A and B) will, in such an instance, be exposed to ILD like material while only one type is exposed to metal.

In an embodiment, the thickness of the coated polymer (Polymer A/B) is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the polymer (A/B) can be important since it may be used to define the ultimate thickness of a subsequently formed permanent ILD layer. That is, in one embodiment, the polymer grating shown in FIG. 4 is eventually replaced with an ILD grating of roughly the same thickness.

In an embodiment, as mentioned above, the grid of polymer 116A/polymer 116B of FIG. 4 is a block copolymer. In one such embodiment, the block copolymer molecule is a polymeric molecule formed of a chain of covalently bonded monomers. In a block copolymer, there are at least two different types of monomers, and these different types of monomers are primarily included within different blocks or contiguous sequences of monomers. The illustrated block copolymer molecule includes a block of polymer 116A and a block of polymer 116B. In an embodiment, the block of polymer 116A includes predominantly a chain of covalently linked monomer A (e.g., A-A-A-A-A . . . ), whereas the block of polymer 116B includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), although the scope of the invention is not so limited. In other embodiments, there may be more than two blocks. Moreover, in other embodiments, each of the blocks may include different types of monomers (e.g., each block may itself be a copolymer). In one embodiment, the block of polymer 116A and the block of polymer 116B are covalently bonded together. The block of polymer 116A and the block of polymer 116B may be of approximately equal length, or one block may be significantly longer than the other.

Typically, the blocks of block copolymers (e.g., the block of polymer 116A and the block of polymer 116B) may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of a first example (as shown in FIG. 4), in two block copolymers, if the blocks are approximately the same length, a grid like pattern of alternating polymer 116A regions and polymer 116B regions is generated. In another embodiment, by way of a second example (described in association with FIG. 5), in two block copolymers, if one of the blocks is longer than the other, but not too much longer than the other, vertical columnar structures may formed. In the columnar structures, the block copolymer molecules may align with their shorter polymer blocks microphase separated into the interior of the columns and their longer polymer blocks extending away from the columns and surrounding the columns. For example, if the block of polymer 116A were longer than the block of polymer 116B, but not too much longer, columnar structures may formed in which many block copolymer molecules align with their shorter blocks of polymer 116B forming columnar structures surrounded by a phase having the longer blocks of polymer 116A. Such an example is further demonstrated in FIG. 5, described below.

In an embodiment, the polymer 116A/polymer 116B grating is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located, which is in contrast to the assembled block copolymer layer portion discussed in association with the resulting structure of FIG. 4. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules.

In one such embodiment, an annealing treatment may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of forces such as surface tension, molecular likes and dislikes, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines). In some embodiments, they may be used to form nano-scale lines or other nano-scale structures that can ultimately be used to form via and openings. In some embodiments, directed self assembly of block copolymers may be used to form vias that are self aligned with interconnects, as described in greater detail below.

With reference again to FIG. 4, in accordance with an embodiment of the present invention, components are added to the above described co-polymer arrangement to render one or more portions of the co-polymer arrangement as photosensitive. In one such embodiment, the added component is one such as, but not limited to, a photo acid generator (PAG), a thermal acid generator (TAG), one or more protecting groups, or one or more cross-linkers. The added components are, in an embodiment, bound to one or both of the DSA block copolymer segments (or, alternatively, blended rather than bound in the system) in such a way that the blocks become differentially scissionable, cross linkable, acid or base soluble under either EUV or e-beam exposure, depending upon which exposure tool is being used, and subsequent chemical amplification of the aerial image. In one such embodiment, the approach is based on the principle that both of the polymers used in the most common BCP material, polystyrene and PMMA, are also used as the base polymers for many EUV resists. Additionally, PMMA is used as a non-chemically amplified e-beam resist. In an embodiment, the effect is that the photoactive BCP remains as a diblock copolymer which can segregate when it is annealed to form useful patterns even prior to exposure, as described above with reference to the alignment to the underlying previous metallization structure.

Figure 5:
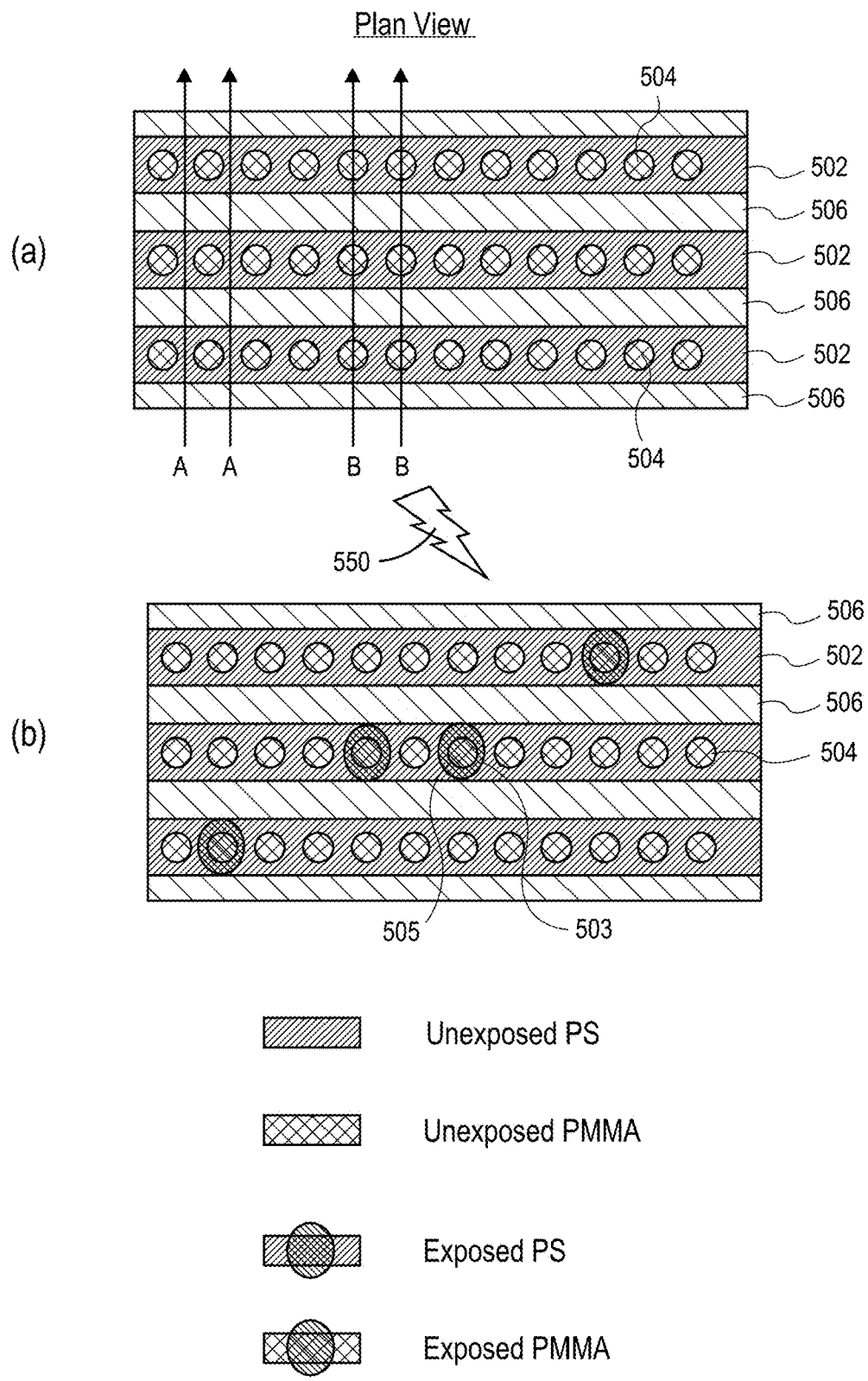
FIG. 5 illustrates plan views of an unexposed photosensitive DSA structure and an exposed photosensitive DSA structure, in accordance with an embodiment of the present invention.

In an aspect, DSA segregated patterns having photosensitive polymer regions for lithographic removal are completely separated physically by either the other polymer or some other physical barrier such as a guide pattern for the DSA. As an example, FIG. 5 illustrates plan views of an unexposed photosensitive DSA structure and an exposed photosensitive DSA structure, in accordance with an embodiment of the present invention. It is to be understood that, in contrast to FIG. 4 where a 1:1 arrangement of PS and PMMA is used to phase separate in a grating pattern, FIG. 5 demonstrates an example of the above described columnar structures which may formed when many block copolymer molecules align with their shorter blocks of one of polymer 116A/116B forming columnar structures surrounded by a phase having the longer blocks of the other of polymer 116A/116B.

Referring to part (a) of FIG. 5, an unexposed photosensitive DSA structure includes unexposed PS 502 and unexposed PMMA 504. The arrows labeled A (not cutting through unexposed PMMA) represent the direction of the underlying metal or ILD lines from FIG. 1. Meanwhile, the arrows labeled B (cutting through unexposed PMMA) represent the direction of the underlying of the other of the metal or ILD lines form FIG. 1. A DSA directing structure or grating 506 (such as permanent or sacrificial ILD lines, such as lines 110 from the previous Figures) may be included, as described above. In an embodiment, the arrangement depicted in FIG. 5 ensures that the quality of patterning after removal of the exposed polymer is determined not by the quality of the aerial image but the physical boundaries between both polymers or the boundary between the guide and the removed polymer. It is to be understood that differences in the thermodynamic phase diagram between blocked versus non-blocked PMMA may have to be accounted for.

Figure 6:
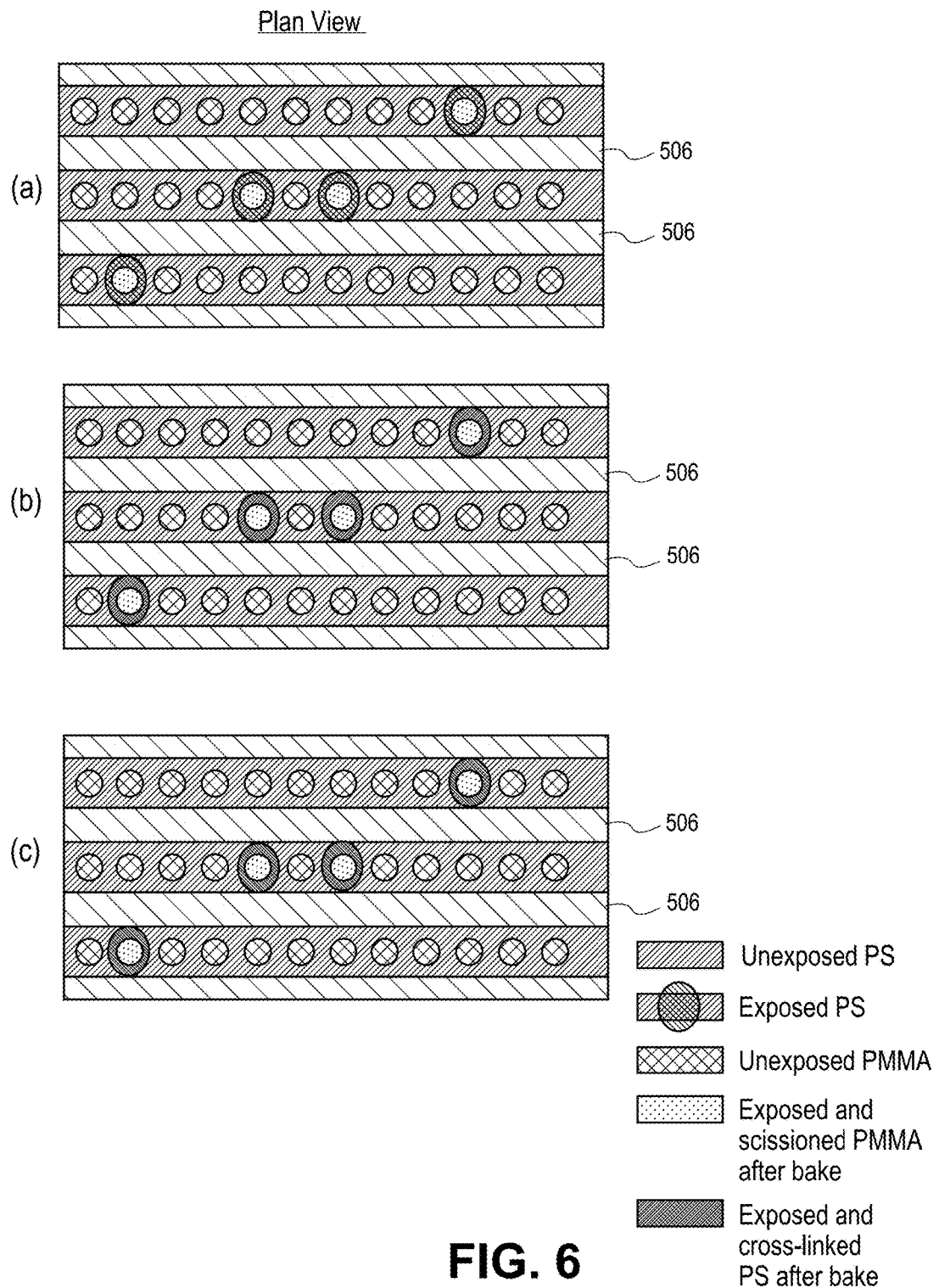
FIG. 6 illustrates plan views demonstrating three possibilities for patterning a photosensitive DSA structure, in accordance with an embodiment of the present invention.

In accordance with an embodiment of the present invention, the photoactive properties of a DSA structure provides the ability to effectively "plug" or "cut" one type of DSA polymer regions with e-beam or EUV exposure. Referring to part (b) of FIG. 5, following EUV or e-beam exposure "cutting" 550, exposed PMMA region 505 and, possibly, surrounding exposed PS regions 503 are formed. There are several ways in which to perform such patterning. FIG. 6 illustrates plan views demonstrating three possibilities for patterning a photosensitive DSA structure, in accordance with an embodiment of the present invention.

Referring to part (a) of FIG. 6, in a first scenario, the PMMA portion of the block co-polymer has a PAG moiety either bound to the PMMA polymer or blended in solution along with a PMMA-bound protecting group which scissions PMMA when activated but does not scission PS. The PS has no bound PAG or other additives. The effect of the PAG and/or protecting group being bound to the PMMA is to localize the scissioning to regions near the PMMA only. In this first scenario, the approach is to effectively "cut" the PMMA features for removal by exposing the PMMA. Development removes the exposed PMMA and leaves the exposed PS and the unexposed PS and PMMA. In one such embodiment, the photo activation energy of the PAG and protecting group for the PMMA is tailored in a way that it is substantially lower than that required to chain-scission the PMMA. In a specific such embodiment, given that the dose required to scission neat PMMA non-selectively is approximately 0.5 J/cm$^2$, it is possible to judiciously select multiple candidate PAG and protecting groups that will have the requisite chemical reactivity well below this limit. If performed in such a way that the PS-PMMA boundaries completely define the desired feature after segregation, then the PMMA photoresist portion of the block co-polymer may be designed without a quencher or any other additives normally used for photoresists to control PAG diffusion and latent image contrast. In an embodiment, then, the action of the PAG and protecting group is effectively confined to the desired PMMA island by the surrounding PS and the fact that the protecting group is bound to the PMMA. The result is to free up the material designs from dose constraints normally associated with standard EUV and e-beam photoresists and to enable formulation of the lowest possible dose.

Referring to part (b) of FIG. 6, in a second scenario, the PMMA portion of the block co-polymer has a PAG and/or protecting group moiety bound to the PMMA polymer as in the first scenario, and the PS has a cross-linker or other moiety bound to it which cross-links PS but not PMMA. Any light which unintentionally exposes the PS will cross-link the PS so that it remains after development. In one embodiment, since the moieties are bound to the PMMA, the scissioning is localized to regions near the PMMA only. In this second scenario, the approach is to effectively "cut" the PMMA features for removal by exposing the PMMA. The tail of any image which leaks into the adjoining PS regions will simply cross link the PS and render the PS even less soluble in developer, allowing for even better dissolution contrast at the feature boundary. Development removes the exposed PMMA and leaves the exposed cross-linked PS and the unexposed PS and PMMA. If performed in such a way that the PS-PMMA boundaries completely define the desired feature after segregation, then the PMMA photoresist portion of the block co-polymer can be designed without a quencher or any other additives normally used for photoresists to control PAG diffusion and latent image contrast. In one embodiment, then, the action of the PAG and/or protecting group is effectively confined to the desired PMMA island by the surrounding PS and since the PAG and/or protecting group is bound to the PMMA. The result is to free up the material designs from dose constraints normally associated with standard EUV and e-beam photoresists and to enable formulation of the lowest possible dose.

Referring to part (c) of FIG. 6, in a third scenario, a PAG and/or protecting groups/cross-linkers is used which scissions PMMA and cross-links PS. In one such embodiment, the PAG is added in the block co-polymer solution and not bound to either copolymer. After exposing the PMMA, in an embodiment, during post exposure bake (PEB) the PAG will migrate from the activated PMMA into the adjoining PS and cross-link the PS nearest the PMMA leading to better defined feature boundaries after develop. In this third scenario, the approach is to effectively "cut" the PMMA features for removal by exposing the PMMA. The tail of any image which leaks into the adjoining PS regions may cross-link the PS and render the PS even less soluble in developer allowing for even better dissolution contrast at the feature boundary. Development removes the exposed PMMA and leaves the exposed cross-linked PS and the unexposed PS and PMMA. If performed in such a way that the PS-PMMA boundaries completely define the desired feature after segregation, then the material design may have more latitude to accommodate very low doses. In one such embodiment, a latent image is smeared more than normal. This can hold as long as the image does not smear so much that activated mobile PAG from one PMMA region begins to scission the next PMMA region in the array. In the case of such an effect, in one embodiment, such smearing is mitigated by adding a quencher which is bound to the PS and allows for even lower doses. It is to be understood that the above description of scenarios 1-3 concerning PMMA and PS can be reversed, in accordance with additional embodiments of the present invention.

Figure 7:
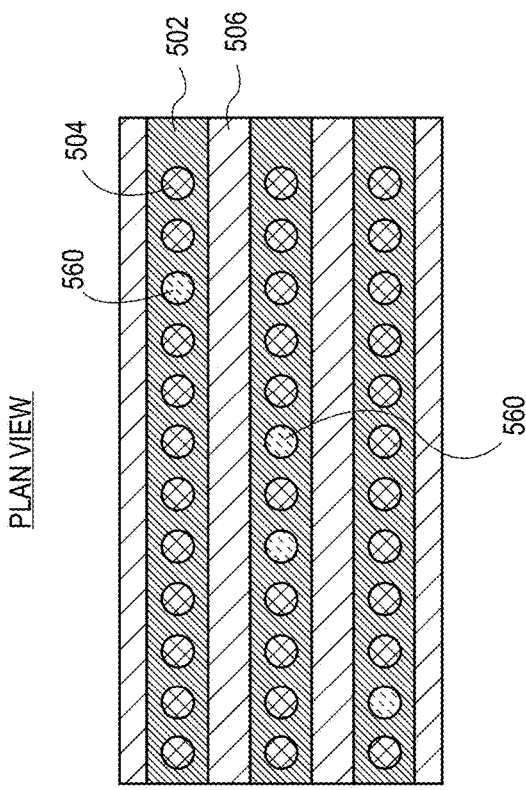
FIG. 7 illustrates a plan view and corresponding cross-sectional view following development of all possible scenarios of FIG. 6, in accordance with an embodiment of the present invention.

FIG. 7 illustrates a plan view and corresponding cross-sectional view following development of all possible scenarios of FIG. 6, in accordance with an embodiment of the present invention. Referring to FIG. 7, opening 560 are formed upon development of the exposed regions of FIG. 6. The openings may be used as eventual conductive via locations or, alternatively, as eventual insulating plug locations in a back end of line interconnect structure.

Figure 8:
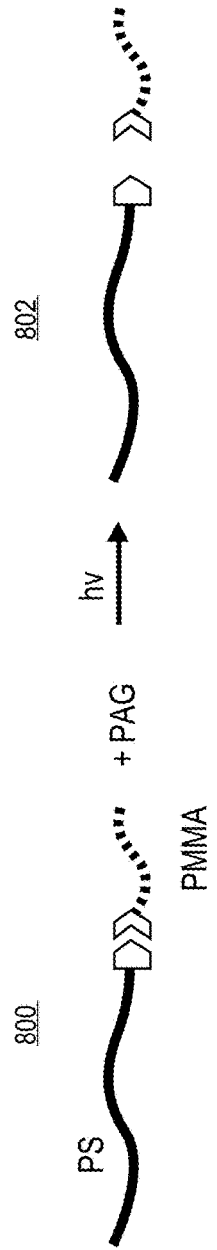
FIG. 8 illustrates a schematic showing a PS/PMMA linkage associated with a PAG which cleaves upon light (hv)

Referring again to FIGS. 5-7, in an embodiment, in order to pattern the above described co-polymeric arrangement by fully removing one polymer from the segregated matrix, the covalent bond between the two polymers in each molecule is broken. As an example, FIG. 8 illustrates a schematic showing a PS/PMMA linkage 800 associated with a PAG which cleaves upon light (hv) exposure to provide a cleaved pairing 802, in accordance with an embodiment of the present invention. To accomplish such cleaving, it may be necessary to incorporate acid cleavable linker between PS and PMMA block for efficient bond breaking. As an example, FIG. 9 illustrates a schematic and corresponding clock co-polymer image for each of an acetal based junction 900 and a trityl ether junction 902, in accordance with an embodiment of the present invention.

One or more of the above described embodiment, provide a significantly improved approach to "cutting" or "plugging" patterned DSA. One or more embodiment further provide a photoresist for EUV and e-beam requiring much lower doses. Upon implementing approaches described herein, throughput may be raised sufficient to render such approaches as feasible while actually pushing LWR and CDU to their lower physical limits unconstrained by the quality of the associated aerial image. One or more new aspects include, but are not limited to, (1) the use of EUV or e-beam exposure to resolve individual polymer domains (other approaches intend the lithography as a way of removing all domains of one type and therefore do not need the resolution capability inherent with EUV or e-beam), (2) designed of an "on" or "off" switch approach to individual domains (none of the feature edges after patterning will be determined by the aerial image so concerns of CDU/LWR with the small wavelength patterning are greatly mitigated), (3) much greater flexibility is provided for pursuing extremely aggressive polymer photo chemistry paths which can lower the dose to print and therefore potentially enable the use of EUV and e-beam technology while maintaining the excellent small CD performance, tight pitches, and low CDU and LWR associated with DSA. As such, in an embodiment, EUV/e-beam lithography and DSA enable each other in production.

Overall, in accordance with an embodiment of the present invention, a DSA approach is rendered as photosensitive. In one view, a form "photobuckets" is achieved where lithographic constraints may be relaxed and misalignment tolerance may be high since the photobucket (e.g., regions 504) is surrounded by non-photolyzable materials. Furthermore, in an embodiment, instead of exposing at, e.g. 30 mJ/cm2, such a photobucket might be exposed at, e.g., 3 mJ/cm2. Normally this would result in very poor CD control and roughness. But in this case, the CD and roughness control will be defined by the photobucket geometry, which can be very well controlled and defined. Thus, such a photobucket approach may be used to circumvent imaging/dose tradeoff which limits the throughput of next generation lithographic processes.

The resulting patterned DSA materials described in association with FIGS. 5-7 may ultimately be used as a scaffolding from which permanent layers are ultimately formed. That is, it may be the case that none of the DSA materials exist in a final structure, but rather are used to direct fabrication of a finalized interconnect structure. In one such embodiment, a permanent ILD replaces one or more regions of the DSA material and subsequent processing (such as metal line fabrication) is completed. That is, it is possible that all DSA components ultimately removed for final self-aligned via and plug formation.

Provided merely as an example of a final structure that may be obtained. FIG. 10 illustrates a plan view and corresponding cross-sectional views of a DSA-based structure following metal line, via and plug formation, in accordance with an embodiment of the present invention. Referring to the plan view and corresponding cross-sectional views (a) and (b) taken along axes, a-a' and b-b', respectively, an upper level of metal lines 140 is provided in a dielectric framework 120'/128'/134. The metal lines 140 are coupled with underlying metal lines 102 through the predetermined via locations (an example of which is shown in cross-sectional view (a)), and are isolated by plugs (examples of which include plugs 142 and 144). The underlying lines 102 and 104 are those described in association with FIG. 1, as formed in a direction orthogonal to the metal lines 140. It is to be understood that, in subsequent fabrication operations, the material layer lines 134 may be removed to provide air gaps between the resulting metal lines 140.

A resulting structure such as that described in association with FIG. 10 may subsequently be used as a foundation for forming subsequent metal line/via and ILD layers. Alternatively, the structure of FIG. 10 may represent the final metal interconnect layer in an integrated circuit. It is to be understood that the above process operations may be practiced in alternative sequences, not every operation need be performed and/or additional process operations may be performed. Furthermore, although the above process flow focused on applications of directed self-assembly (DSA), selective growth processes may be used instead in one or more locations of the process flow. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc.

Each of the processor, the memory, and the chipset, may potentially be manufactured using the approaches disclosed herein.

FIG. 11 illustrates a computing device 1100 in accordance with one implementation of the invention. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the invention, the integrated circuit die of the processor includes one or more structures, such as self-aligned vias and plugs, built in accordance with implementations of the invention. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of the invention, the integrated circuit die of the communication chip includes one or more structures, such as self-aligned vias and plugs, built in accordance with implementations of the invention.

In further implementations, another component housed within the computing device 1100 may contain an integrated circuit die that includes one or more structures, such as self-aligned vias and plugs, built in accordance with implementations of the invention.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Thus, embodiments of the present invention include self-aligned via and plug patterning for back end of line (BEOL) interconnects.

In an embodiment, a structure for directed self-assembly includes a substrate and a block co-polymer structure disposed above the substrate. The block co-polymer structure has a polystyrene (PS) component and a polymethyl methacrylate (PMMA) component. One of the PS component or the PMMA component is photosensitive.

In one embodiment, the one of the PS component or the PMMA component that is photosensitive includes an added component such as, but not limited to, a photo acid generator (PAG), a thermal acid generator (TAG), a protecting group, or a cross-linker.

In one embodiment, the added component is bound to the one of the PS component or the PMMA component that is photosensitive.

In one embodiment, the added component is blended with the one of the PS component or the PMMA component that is photosensitive.

In one embodiment, the one of the PS component or the PMMA component that is photosensitive and having the added component is differentially scissionable, cross-linkable or acid or base soluble upon irradiation.

In one embodiment, the irradiation involves exposing to an extreme ultra-violet (EUV) source or an e-beam source.

In one embodiment, the ratio of the PS component to the PMMA component in the block co-polymer structure is approximately 1:1.

In one embodiment, the block co-polymer structure is disposed above a pattern of alternating metal lines and dielectric lines disposed above the substrate.

In an embodiment, a method of fabricating an interconnect structure for a semiconductor die involves forming a first level of alternating metal lines and dielectric lines above a substrate. The method also involves forming a block co-polymer structure above, and having a pattern directed by, the first level of alternating metal lines and dielectric lines, the block co-polymer structure having a polystyrene (PS) component and a polymethyl methacrylate (PMMA) component. One of the PS component or the PMMA component is bound to or blended with a photo acid generator (PAG) moiety and is bound to a protecting group. The method also involves irradiating a portion of the block co-polymer structure. The bound protecting group scissions the one of the PS component or the PMMA component, but not the other, upon the irradiating. The method also involves developing the block co-polymer structure to provide a patterned block co-polymer structure.

In one embodiment, the irradiating and developing scissions and removes irradiated portions of the one of the PS component or the PMMA component.

In one embodiment, the PAG moiety or the bound protecting group localizes the scission to the one of the PS component or the PMMA component.

In one embodiment, irradiating the portion of the block co-polymer structure involves exposing to an extreme ultraviolet (EUV) source or an e-beam source.

In one embodiment, the patterned block co-polymer structure is used as a scaffolding to form a second level of alternating metal lines and dielectric lines above and coupled to the first level of alternating metal lines and dielectric lines.

In an embodiment, a method of fabricating an interconnect structure for a semiconductor die involves forming a first level of alternating metal lines and dielectric lines above a substrate. The method also involves forming a block co-polymer structure above, and having a pattern directed by, the first level of alternating metal lines and dielectric lines, the block co-polymer structure having a polystyrene (PS) component and a polymethyl methacrylate (PMMA) component. One of the PS component or the PMMA component is bound to a photo acid generator (PAG) moiety, and the other of the PS component or the PMMA component is bound to a cross-linker. The method also involves irradiating a portion of the block co-polymer structure. The PGA moiety scissions the one of the PS component or the PMMA component, and the cross-linker cross-links the other of the PS component or the PMMA component, upon the irradiating. The method also involves developing the block co-polymer structure to provide a patterned block co-polymer structure.

In one embodiment, the irradiating and developing scissions and removes irradiated portions of the one of the PS component or the PMMA component, but not the other of the PS component or the PMMA component.

In one embodiment, the PAG moiety localizes the scission to the one of the PS component or the PMMA component.

In one embodiment, irradiating the portion of the block co-polymer structure involves exposing to an extreme ultraviolet (EUV) source or an e-beam source.

In one embodiment, the patterned block co-polymer structure is used as a scaffolding to form a second level of alternating metal lines and dielectric lines above and coupled to the first level of alternating metal lines and dielectric lines.

In an embodiment, a method of fabricating an interconnect structure for a semiconductor die involves forming a first level of alternating metal lines and dielectric lines above a substrate. The method also involves forming a block co-polymer structure above, and having a pattern directed by, the first level of alternating metal lines and dielectric lines, the block co-polymer structure having a polystyrene (PS) component and a polymethyl methacrylate (PMMA) component and blended with an agent. The method also involves irradiating a portion of the block co-polymer structure. The agent scissions one of the PS component or the PMMA component and cross-links the other of the PS component or the PMMA component upon the irradiating. The method also involves developing the block co-polymer structure to provide a patterned block co-polymer structure.

In one embodiment, the PS component and the PMMA component are blended with the agent such as, but not limited to, a photo acid generator (PAG) or a protecting group.

In one embodiment, the irradiating and developing scissions and removes irradiated portions of the one of the PS component or the PMMA component but not the other of the PS component or the PMMA component.

In one embodiment, irradiating the portion of the block co-polymer structure involves exposing to an extreme ultraviolet (EUV) source or an e-beam source.

In one embodiment, the patterned block co-polymer structure is used as a scaffolding to form a second level of alternating metal lines and dielectric lines above and coupled to the first level of alternating metal lines and dielectric lines.

What is claimed is:

1. A structure for directed self-assembly, the structure comprising:
    a substrate; and
    a block co-polymer structure disposed above the substrate and comprising a polystyrene (PS) component and a polymethyl methacrylate (PMMA) component, wherein the PS component is bound to a photo acid generator (PAG).

2. The structure of claim 1, wherein the ratio of the PS component to the PMMA component in the block co-polymer structure is approximately 1:1.

3. The structure of claim 1, wherein the block co-polymer structure is disposed above a pattern of alternating metal lines and dielectric lines disposed above the substrate.

* * * * *